(12) United States Patent
Chang

(10) Patent No.: US 7,352,053 B2
(45) Date of Patent: Apr. 1, 2008

(54) INSULATING LAYER HAVING DECREASED DIELECTRIC CONSTANT AND INCREASED HARDNESS

(75) Inventor: Hui Lin Chang, Hsin-Chu (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 239 days.

(21) Appl. No.: 10/696,254

(22) Filed: Oct. 29, 2003

(65) Prior Publication Data
US 2005/0093108 A1    May 5, 2005

(51) Int. Cl.
*H01L 23/58* (2006.01)

(52) U.S. Cl. ............... 257/635; 257/640; 257/751; 257/774; 257/E21.26; 257/E21.277; 257/E21.279

(58) Field of Classification Search ........ 257/635, 257/640, 751, 774, 752, 637, 636; 438/627, 438/628, 629
See application file for complete search history.

(56) References Cited

U.S. PATENT DOCUMENTS

| | | | |
|---|---|---|---|
| 5,485,304 A * | 1/1996 | Kaeriyama | .......... 359/291 |
| 5,708,559 A | 1/1998 | Brabazon et al. | |
| 5,821,169 A | 10/1998 | Nguyen et al. | |
| 5,834,845 A | 11/1998 | Stolmeijer | |
| 5,904,565 A | 5/1999 | Nguyen et al. | |
| 5,926,236 A * | 7/1999 | den Boer et al. | .......... 349/51 |
| 6,001,730 A | 12/1999 | Farkas et al. | |
| 6,140,691 A * | 10/2000 | Gardner et al. | .......... 257/506 |
| 6,165,891 A | 12/2000 | Chooi et al. | |
| 6,339,217 B1 * | 1/2002 | Kley | .......... 250/216 |
| 6,352,921 B1 | 3/2002 | Han et al. | |
| 6,424,044 B1 | 7/2002 | Han et al. | |
| 6,429,122 B2 | 8/2002 | Chooi et al. | |
| 6,436,824 B1 | 8/2002 | Chooi et al. | |
| 6,455,912 B1 | 9/2002 | Kim et al. | |
| 6,468,927 B1 | 10/2002 | Zhang et al. | |
| 6,472,306 B1 | 10/2002 | Lee et al. | |
| 6,482,733 B2 | 11/2002 | Raaijmakers et al. | |
| 6,511,922 B2 | 1/2003 | Krishnaraj et al. | |
| 6,518,646 B1 | 2/2003 | Hopper et al. | |
| 2002/0076918 A1 | 6/2002 | Han et al. | |
| 2002/0133258 A1 | 9/2002 | Ngai et al. | |
| 2004/0119163 A1 * | 6/2004 | Wong et al. | .......... 257/758 |
| 2005/0255714 A1 * | 11/2005 | Iyer et al. | .......... 438/793 |

FOREIGN PATENT DOCUMENTS

FR    2775005    *    8/1999

* cited by examiner

*Primary Examiner*—Evan Pert
*Assistant Examiner*—Fazli Erdem
(74) *Attorney, Agent, or Firm*—Haynes Boone, LLP

(57) ABSTRACT

A method of manufacturing a mechanically robust insulating layer, including forming a low-k dielectric layer having a first dielectric constant on a substrate and forming a carbon nitride cap layer on the low-k dielectric layer, the insulating layer thereby having a second dielectric constant that is less than the first dielectric constant.

20 Claims, 2 Drawing Sheets

INSULATING LAYER HAVING DECREASED DIELECTRIC CONSTANT AND INCREASED HARDNESS

BACKGROUND

The present disclosure relates generally to semiconductor device insulating layers and, more specifically, to an insulating layer having a decreased dielectric constant and an increased hardness.

Semiconductor device geometries continue to dramatically decrease in size. For example, existing semiconductor devices routinely include features having dimensions less than 90 nm. A challenge that has become ever more difficult as this scaling continues has been decreasing interconnect RC time constant delay. Those skilled in the art understand that power dissipation due to resistance-capacitance (RC) coupling becomes significant due to increased wiring capacitance, especially interline capacitance between the metal lines on the same metallization level. Smaller line dimensions increase the resistivity of the metal lines and the narrow spacing between the metal lines increases the resulting capacitance. Thus, device speed will increase as dimensions of ultralarge-scale integration devices scale to smaller feature sizes (<0.25 µm).

However, the capacitance between interconnect lines is proportional to the dielectric constant k of the insulating material between the lines. Thus, a reduction in k leads to lower capacitance and a decreased RC delay. Moreover, when the separation between interconnect lines is less than 0.3 µm, the interlayer capacitance is very small compared to the total capacitance. Thus, at sub-0.25 µm feature sizes, as much as 90% of the total capacitance is dominated by line-to-line capacitance. Consequently, a reduction in line-to-line capacitance is one of the most critical issues for sub-0.25 µm devices. An additional advantage in reducing the total capacitance is that it decreases the power dissipation and crosstalk.

However, low-k materials can exhibit a high porosity and low density, such that insulating layers comprising conventional low-k materials typically provide a film having insufficient hardness and excessive film stress. Consequently, a stack of low-k dielectric films can suffer internal stress, due at least in part to lattice mismatches between over-stressed layers. Moreover, such stress may intensify or build up during conventional fabrication procedures requiring substantial application forces and thermal cycling. As a result, the low-k insulating layers may crack or peel, which can increase dielectric constants and decrease hardness values.

Previous attempts to address the problems discussed above include post treatment thermal annealing and $H_2$ or $NH_3$ plasma treatment to increase the film hardness and to help reduce moisture absorption by the low-k dielectric. However, these processes provide only modest improvement in dielectric constants and insufficiently address ongoing issues with excessive stress and insufficient mechanical stability. For example, insulating layers undergoing such post treatment still experience dishing, cracking, pitting and peeling during chemical-mechanical polishing (CMP), and are highly susceptible to copper or other conductive material diffusion even after being annealed.

Therefore, what is needed in the art is an insulating layer and method of manufacture thereof that addresses the problems discussed above.

SUMMARY OF THE DISCLOSURE

To address the above-discussed deficiencies of the prior art, the present disclosure provides a method of manufacturing a mechanically robust insulating layer, including forming a low-k dielectric layer on a substrate, the low-k dielectric layer having a first dielectric constant, and forming a carbon nitride cap layer on the low-k dielectric layer, the insulating layer thereby having a second dielectric constant that is less than the first dielectric constant. Moreover, the carbon nitride cap layer may increase the hardness of the insulating layer, and may also increase the stability of the insulating layer, because carbon nitride is chemically inert, highly thermally stable and has a high breakdown field. The carbon nitride cap layer may also increase the density of the insulating layer, such that the resulting insulating layer is less susceptible to moisture uptake.

The present disclosure also provides an integrated circuit device that, in one embodiment, includes a substrate having at least one microelectronic device located therein and an insulating layer located over the substrate. The insulating layer includes a low-k dielectric layer having a first dielectric constant and a carbon nitride cap layer located on the low-k dielectric layer, the insulating layer thereby having a second dielectric constant that is less than the first dielectric constant.

The present disclosure also provides another embodiment of an integrated circuit device that includes a first via contacting a microelectronic device in a substrate and extending through a first insulating layer located over the substrate, a first trench contacting the first via and extending through a second insulating layer located over the first insulating layer, a second via contacting the first trench and extending through a third insulating layer located over the second insulating layer, and a second trench contacting the second via and extending through a fourth insulating layer located over the third insulating layer. At least one of the first, second, third and fourth insulating layers includes a dielectric layer having a first dielectric constant and a first carbon nitride cap layer located on the dielectric layer, the at least one of the first, second, third and fourth insulating layers thereby having a second dielectric constant that is less than the first dielectric constant.

The present disclosure also includes a semiconductor device including, in one embodiment, a plurality of doped regions formed in a substrate and a plurality of isolation regions each proximate a junction of adjacent ones of the plurality of doped regions. At least a portion of each of the plurality of isolation regions comprises carbon nitride.

The present disclosure also includes a MEMs device including, in one embodiment, a landing yoke configured to deflect in response to biasing thereof, a mirror element coupled to the landing yoke and a control bus configured to bias the landing yoke. At least one of the landing yoke, the mirror element and the control bus includes a contact area coated with carbon nitride.

The foregoing has outlined preferred and alternative features of several embodiments so that those skilled in the art may better understand the detailed description that follows. Additional features will be described below that further form the subject of the claims herein. Those skilled in the art should appreciate that they can readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. Reference is now made to the following descriptions taken in conjunction with the accompanying drawings.

DETAILED DESCRIPTION

Figure 1:
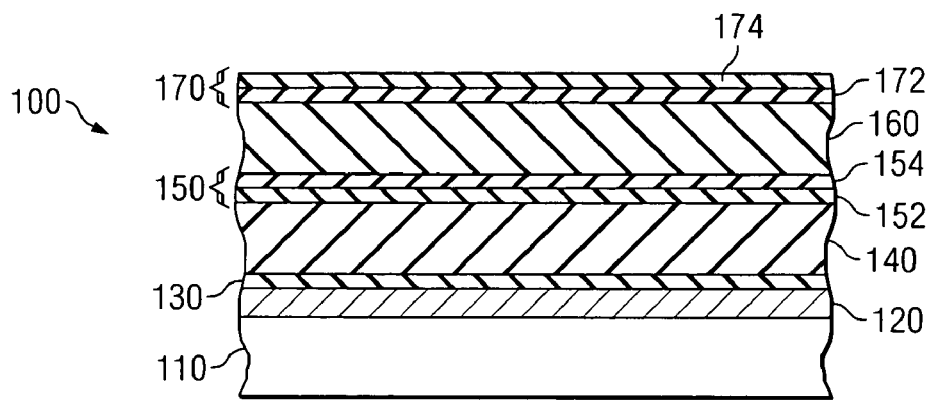
FIGS. 1 and 2 illustrate sectional views of one embodiment of a semiconductor device in first and second intermediate stages of manufacture, respectively, according to aspects of the present disclosure.

It is to be understood that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Referring to FIG. 1, illustrated is a sectional view of a semiconductor device 100 in an intermediate stage of manufacturing according to aspects of the present disclosure. The semiconductor device 100 includes a substrate 110, which may be a single crystal or other silicon substrate, a silicon-on-insulator (SOI) substrate comprising a silicon or germanium epitaxial layer on a silicon or sapphire substrate, a plastic or other flexible substrate, or other conventional or future-developed substrates. Although not illustrated as such, the substrate 110 may include one or more layers of dielectric material and conductive material and one or more active and/or passive devices.

A conductive layer 120 that may be an interconnect pattern or line is formed over the substrate 110. The conductive layer 120 may comprise copper, tungsten, doped silicon or other conductive materials, and may include a refractory metal barrier. The conductive layer 120 may be formed by spin-on deposition, dry plasma etching, chemical-vapor-deposition, sputter deposition, thermal deposition, evaporation, physical vapor transport or other conventional or future-developed processes. In one embodiment, the conductive layer 120 may have a thickness ranging between about 5000 Angstroms and about 10,000 Angstroms and a line width ranging between about 10 Angstroms and about 10,000 Angstroms.

A passivation layer 130 may be located over the first conductive layer 120. The passivation layer 130 may comprise silicon nitride, which may promote the adhesion of subsequently formed layers to the first conductive layer 120 and prevent diffusion between the first conductive layer 120 and other layers. However, in one embodiment, the passivation layer 130 may comprise carbon nitride of the composition $C_xN_y$, wherein x may range between about 0.1 and about 0.9 and y may range between about 0.1 and about 0.9. Carbon nitride may be capable of withstanding higher stress levels than conventional passivation materials during subsequent processing. Employing carbon nitride to form the passivation layer 130 may also reduce parasitic capacitance between contacts and/or vias, because carbon nitride may have a lower dielectric constant than many conventional passivation materials. The passivation layer 130 may be amorphous or polycrystalline carbon nitride, and may be formed by spin-on deposition, dry plasma etching, chemical-vapor-deposition, sputter deposition, thermal deposition, evaporation, physical vapor transport or other conventional or future-developed processes. The passivation layer 130 may have a thickness ranging between about 50 Angstroms and about 800 Angstroms.

A first dielectric layer 140 is formed over the passivation layer 130. The first dielectric layer 140 may comprise silicon dioxide, hydrogen-doped silicon dioxide, fluorine-doped silicon dioxide, carbon-doped silicon dioxide, an organic polymer (comprised of carbon and hydrogen), a fluorine-doped organic polymer or other materials. The first dielectric layer 140 may be formed by spin-on deposition, dry plasma etching, chemical-vapor-deposition, sputter deposition, thermal deposition, evaporation, physical vapor transport or other conventional or future-developed processes, and may have a thickness ranging between about 250 Angstroms and about 10,000 Angstroms.

An etch stop layer 150 is formed over the first dielectric layer 140. In one embodiment, the etch stop layer 150 may comprise silicon nitride or other conventional etch stop materials deposited by spin-on deposition, dry plasma etching, chemical-vapor-deposition, sputter deposition, thermal deposition, evaporation, physical vapor transport or other conventional or future-developed processes. In another embodiment, the etch stop layer 150 may comprise carbon nitride that may be similar in composition and manufacture to the carbon nitride passivation layer 130 described above. In the illustrated embodiment, the etch stop layer 150 includes a carbon nitride layer 152 and a silicon nitride layer 154. As with the passivation layer 130, employing carbon nitride as at least a portion of the etch stop layer 150 can provide increased mechanical stability, increased resistance to moisture entrapment and lower tensile stress. The etch stop layer 150 may have a thickness that ranges between about 50 Angstroms and about 800 Angstroms.

A second dielectric layer 160 is formed over the etch stop layer 150. The second dielectric layer 160 may be substantially similar in composition and manufacture to the first dielectric layer 140.

A cap layer 170 is formed over the second dielectric layer 140. In one embodiment, the cap layer 170 comprises silicon nitride or other conventional etch stop or anti-reflective coating materials, and may be deposited by spin-on deposition, dry plasma etching, chemical-vapor-deposition, sputter deposition, thermal deposition, evaporation, physical vapor transport or other conventional or future-developed processes. In another embodiment, the cap layer 170 may comprise carbon nitride that may be similar in composition and manufacture to the carbon nitride passivation layer 130 described above. In the illustrated embodiment, the cap layer 170 includes a carbon nitride layer 172 and a silicon nitride layer 174. As with the passivation layer 130, employing carbon nitride as at least a portion of the cap layer 170 can provide increased mechanical stability, increased resistance to moisture entrapment and lower tensile stress. The cap layer 170 may have a thickness that ranges between about 50 Angstroms and about 800 Angstroms.

It is understood that the description of FIG. 1 is only one embodiment of a semiconductor device that can benefit from the present invention. Other semiconductor devices that can benefit from the present invention may not include all of the above-described layers and/or configurations.

Figure 2:
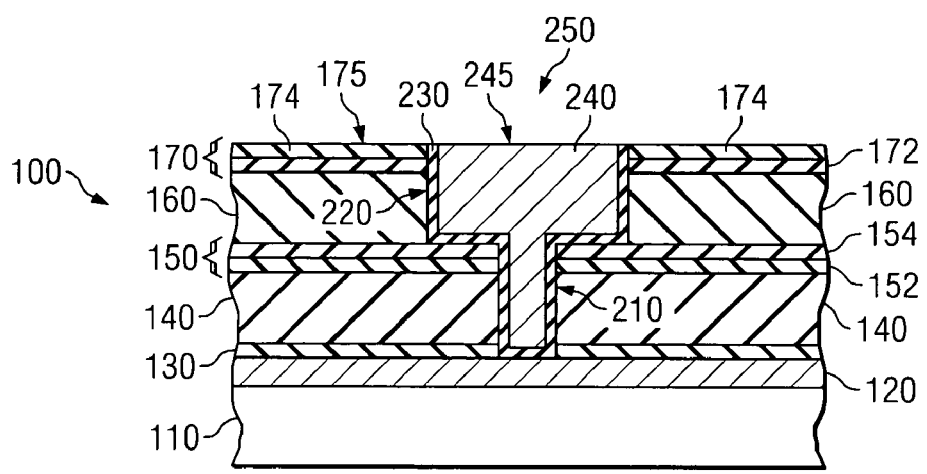

Referring to FIG. 2, illustrated is a sectional view of the device 100 shown in FIG. 1 in a subsequent stage of manufacture according to aspects of the present disclosure. As shown in the illustrated embodiment, the layers over the conductive layer 120 may be patterned to form a via opening 210 and the layers over the etch stop layer 150 may be patterned to a trench opening 220 that at least partially intersects or envelopes the footprint of the via opening 210. The via and trench openings 210, 220 may be formed by wet or dry etching processes employing the conductive layer 120 and the etch stop layer 150 as etch end points, respectively, or by other conventional or future-developed patterning processes.

A barrier layer 230 may be employed to line the via and trench openings 210, 220, as shown in FIG. 2. The barrier layer 230 may prevent diffusion between the previously formed layers and subsequently formed layers, and may also promote adhesion of the subsequently formed layers within the via and trench openings 210, 220. The barrier layer 230 may comprise TaN, TiN, WN, TiW, TaSiN, Ta or other materials. The barrier layer 230 may be formed by CVD, electroplating, plasma enhanced CVD (PECVD), physical vapor deposition (PVD) or other conventional or future-developed methods, possibly to a thickness ranging between about 300 Angstroms and about 10,000 Angstroms.

A bulk conductive layer 240 may then be employed to fill the via and trench openings 210, 220. The bulk conductive layer 240 may comprise copper, gold, tungsten, aluminum, doped polysilicon or other conductive materials, and may be deposited by CVD, electroplating, plasma enhanced CVD (PECVD), physical vapor deposition (PVD) or other processes. The barrier layer 230 and the bulk conductive layer 240 may then planarized, such as by chemical-mechanical polishing (CMP) or a plasma etch-back process, to provide a substantially planar surface 245 that is substantially coplanar with the top surface 175 of the cap layer 170. The barrier layer 230 and the bulk conductive layer 240 within the openings 210, 220 collectively form an interconnect element 250, which may be a dual-damascene element as shown in FIG. 2, or may be a single-damascene element.

Typically, as a result of CMP, dishing, cracking, and pitting can occur in the cap layer 170 and the second dielectric layer 160. However, because the capping layer 170 may comprise carbon nitride, the mechanical rigidity of the device 100 may be improved, such that these problems may be prevented. Thus, in one embodiment, the cap layer 170, the second dielectric 160, the etch stop 150, the first dielectric 140, and the passivation layer 130 may all comprise carbon nitride to further prevent cracking, pitting, and dishing. Moreover, employing carbon nitride in all off these layers may also provide enhanced protection against diffusion with adjacent layers, a significant reduction in parasitic capacitance and increased mechanical resistance to stress.

Moreover, in view of the relative ease in which carbon nitride films may be deposited and implemented into existing fabrication procedures with conventional manufacturing equipment and processes, carbon nitride films according to aspects of the present disclosure may be readily employed as coatings for one or more other layers and as encapsulation of low-k dielectric films and others. In some embodiments, deposition of a carbon nitride film by CVD or ALD according to aspects of the present disclosure may include the use of a C-H containing gas species, such as (without limitation) $C_2H_4$, $CH_4$, $C_3H_8$ and other perfluorocarbons. Some embodiments of forming a carbon nitride film according to aspects of the present disclosure may also employ a reducing agent such as $NH_3$ and $N_2$. Another embodiment may include the deposition of a diamond-like coating (DLC) by PECVD followed by a decoupled nitrogen plasma (DNP) or other nitridation process. Such a nitridation process may impregnate nitrogen atoms into the first few monolayers of a DLC to form one or more carbon nitride layers. Another method for producing a carbon nitride film according to aspects of the present disclosure may employ PVD with magnetron sputtering, wherein target materials may include graphite, azaadenine, adnine or melamine in combination with $N_2$ and/or $NH_3$. Another sputter method that may be employed to deposit a carbon nitride material might employ a DC magnetron with an auxiliary antenna and RF or DC bias on the substrate.

Figure 3:
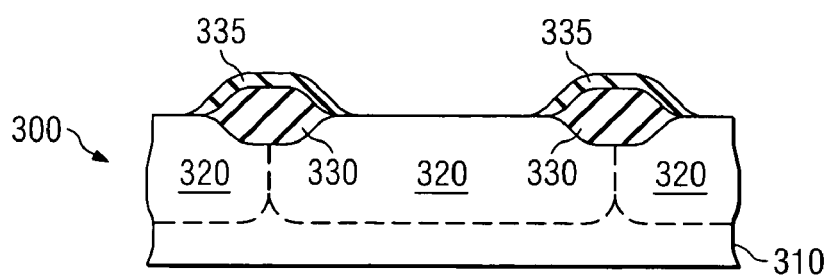
FIG. 3 illustrates a sectional view of another embodiment of a semiconductor device in an intermediate stage of manufacture according to aspects of the present disclosure.

Referring to FIG. 3, illustrated is a sectional view of another embodiment of a semiconductor device 300 in an intermediate stage of manufacture according to aspects of the present disclosure. The device 300 includes a substrate 310 having doped regions or wells 320 conventionally formed therein. In one embodiment, adjacent ones of the wells 320 may be oppositely doped, such as in a typical complementary metal-oxide-semiconductor (CMOS) doping scheme. The device 300 also includes isolation structures 330 each proximate a junction of adjacent ones of the wells 320. In the illustrated embodiment, the isolation structures 330 are conventional field oxide regions epitaxially grown over the substrate 310. However, although not illustrated as such, the isolation structures 330 may also be local oxidation of silicon (LOCOS) elements, shallow trench isolation (STI) elements, or other suitable structures.

In a preferred embodiment, the isolation structures 330 comprise carbon nitride or a carbon nitride layer 335. In one embodiment, the isolation structures 330 may comprise carbon nitride of the composition $C_xN_y$, wherein x may range between about 0.1 and about 0.9 and y may range between about 0.1 and about 0.9. The isolation structures 330 may comprise amorphous or polycrystalline carbon nitride, and may be formed by any of the previously mentioned processing methods. Carbon nitride may be capable of withstanding higher stress levels than conventional passivation materials during subsequent processing. Carbon nitride may also have a dielectric constant that is substantially lower than the dielectric constant of other isolation materials typically employed in such isolation structures, thereby providing a significant improvement in electrical isolation and providing additional mechanical strength to the device 300. Moreover, LOCOS capped with carbon nitride may prevent moisture entrapment and allow for a lower thermal budget during front end fabrication of the device 300.

Figure 4:
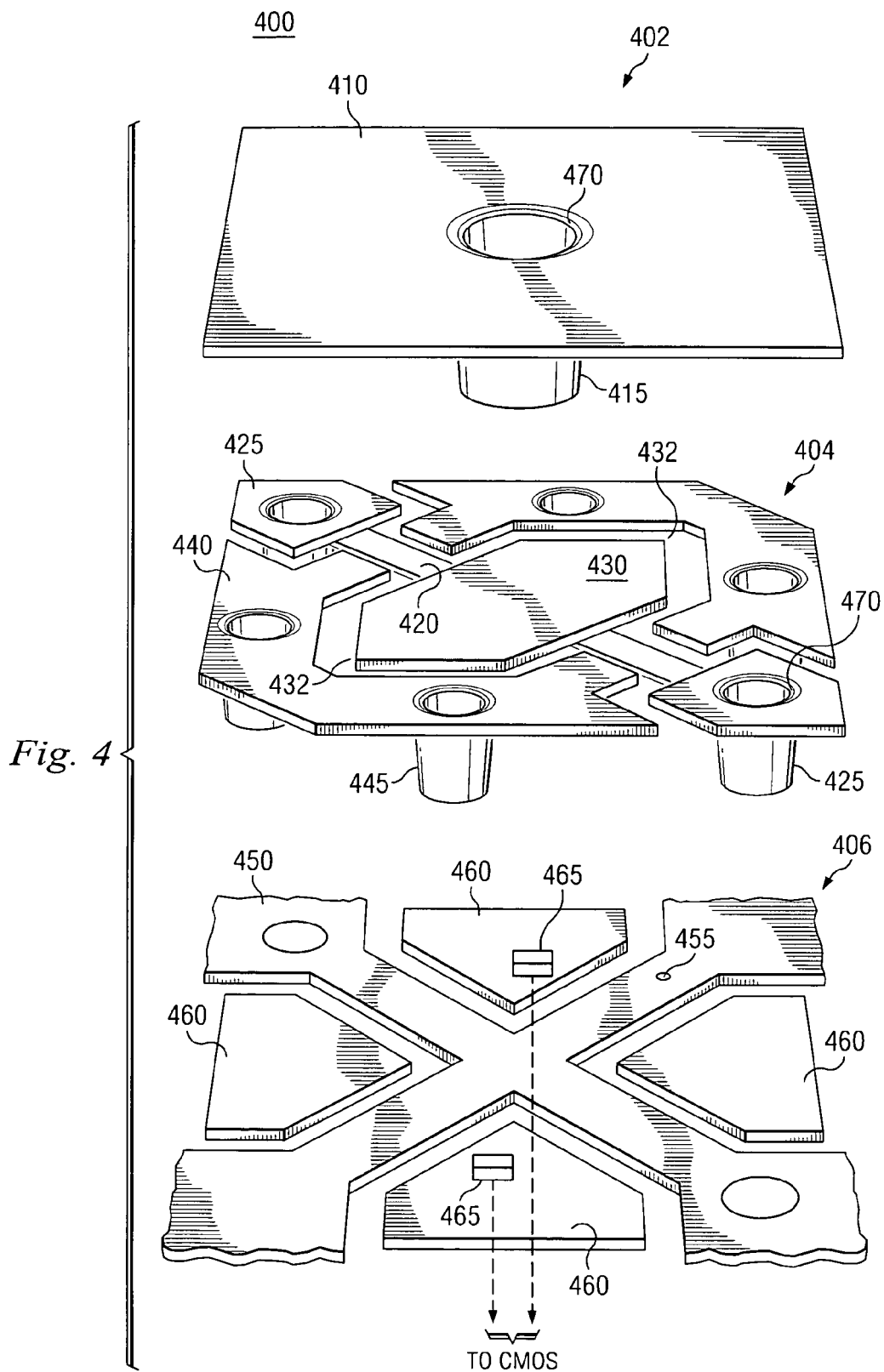
FIG. 4 illustrates an exploded perspective view of one embodiment of a device constructed according to aspects of the present disclosure.

Referring to FIG. 4, illustrated is an exploded perspective view of one embodiment of a mirror device 400 constructed according to aspects of the present disclosure. In the embodiment illustrated in FIG. 4, the mirror device 400 includes three sections 402, 404, 406. The first section 402 includes a mirror element 410 supported by a mirror support post 415 separating the first and second sections 402, 404. The second section 404 includes torsion hinges 420 that couple actuator support posts 425 and a landing yoke 430. The second section 404 also includes address electrodes 440 supported by electrode support posts 445. The actuator support posts 425 and the electrode support posts 445 separate the second and third sections 404, 406. The third section 406 includes a control bus 450 and address pads 460. When the mirror 410 is actuated (deflected or tilted in response to biasing), one of the tips 432 of the landing yoke 430 may contact the control bus 450. The control bus 450 and the landing pads 460 include contacts 455, 465 for interconnection with address control circuitry, such as a CMOS circuitry, formed below the mirror device 400.

Each of the support posts 415, 425, 445 may include sidewall rings 470 typically comprising an oxide. The sidewall rings 470 are typically employed as a spacer, and offer mechanical strength to the interfaces between the support posts 415, 425, 445 and mating features. In one embodiment, the sidewall rings 470 may comprise carbon nitride of the composition $C_xN_y$, wherein x may range between about 0.1 and about 0.9 and y may range between about 0.1 and about 0.9. The sidewall rings 470 may comprise amorphous or polycrystalline carbon nitride, and may be formed by any of the previously mentioned processing methods. As such, the mechanical stability and wear resistance of the mirror device 400 may be improved. The tips 432 if the landing yoke 430 may also comprise or be coated with carbon nitride. Consequently, the tips 432 may be more resistant to wear and damage resulting from the contact with the control bus 450.

Thus, the present disclosure introduces the general concept of incorporating carbon nitride as an additional and/or replacement insulating material. As discussed above, carbon nitride provides greater mechanical hardness and moisture prevention to existing dielectric materials, such that devices incorporating the carbon nitride films may be more mechanically robust, wear resistant and reliable. For example, the hardness of a carbon nitride capping layer may provide protection against stress applied during subsequent processing and handling. Carbon nitride compositions may also be highly compressive, which may compensate for the tensile stress of conventional low-k dielectric films, thereby contributing to the prevention of film cracking and peeling. Consequently, adhesion of layers within a device stack comprising dielectric layers, such as an interconnect structure, may be improved by the incorporation of a carbon nitride layer. Carbon nitride compositions within the scope of the present disclosure may also be chemically inert and have a high breakdown field, further contributing to the robustness and reliability of the resulting devices. Carbon nitride may also have a low dielectric constant, such as between about 1.8 and about 3.6, whereby incorporation of carbon nitride into a stack of dielectric layers may decrease the dielectric constant of the stack.

The present disclosure has been described relative to a preferred embodiment. Improvements or modifications that become apparent to persons of ordinary skill in the art only after reading this disclosure are deemed within the spirit and scope of the application. It is understood that several modifications, changes and substitutions are intended in the foregoing disclosure and in some instances some features of the disclosure will be employed without a corresponding use of other features. Accordingly, it is appropriate that the appended claims be construed broadly and in a manner consistent with the scope of the disclosure.

The invention claimed is:

1. An integrated circuit device, comprising:
   a substrate having at least one microelectronic device located therein; and
   an insulating layer located over the substrate, including:
      a thin-film, low-k dielectric layer having a first dielectric constant; and
      a carbon nitride cap layer located on the low-k dielectric layer, wherein the carbon nitride cap layer has a second dielectric constant that is less than the first dielectric constant, such that the insulating layer has a third dielectric constant that is less than the first dielectric constant.

2. The device of claim 1 wherein the thin-film, low-k dielectric layer has a first hardness and the carbon nitride cap layer has a second hardness that is greater than the first hardness, such that the insulating layer has a third hardness that is greater than the first hardness.

3. The device of claim 1 wherein the cap layer has a composition of $C_xN_y$, where x ranges between 0.1 and 0.9 and y ranges between about 0.1 and 0.9.

4. The device of claim 1 wherein the low-k dielectric layer comprises a material selected from the group consisting of:
   silicon dioxide;
   hydrogen-doped silicon dioxide;
   fluorine-doped silicon dioxide;
   carbon-doped silicon dioxide; and
   an organic polymer.

5. The device of claim 1 wherein the carbon nitride cap layer is a first carbon nitride cap layer formed on a first major surface of the low-k dielectric layer and further comprising a second carbon nitride cap layer contacting a second major surface of the low-k dielectric layer.

6. The device of claim 1 wherein the carbon nitride cap layer is formed by a process selected from the group consisting of:
   ALD;
   CVD;
   PECVD; and
   PVD.

7. The device of claim 6 wherein the carbon nitride cap layer is formed by a process gas selected from the group consisting of:
   $C_2H_4$;
   $CH_4$; and
   $C_3H_8$.

8. The device of claim 6 wherein the carbon nitride cap layer is formed by a process gas selected from the group consisting of:
   $N_2$;
   $NH_3$; and
   $N_2H_4$.

9. The device of claim 6 wherein the process is PVD utilizing a target comprising a material selected from the group consisting of:
   graphite;
   azaadenine;
   adnine; and
   melamine.

10. The device of claim 1 wherein the carbon nitride cap layer has a thickness ranging between about 50 Angstroms and about 800 Angstroms.

11. An integrated circuit device, comprising:
a first via contacting a microelectronic device in a substrate and extending through a first insulating layer located over the substrate;
a first trench contacting the first via and extending through a second insulating layer located over the first insulating layer;
a second via contacting the first trench and extending through a third insulating layer located over the second insulating layer; and
a second trench contacting the second via and extending through a fourth insulating layer located over the third insulating layer;
wherein at least one of the first, second, third and fourth insulating layers includes:
a dielectric layer having a first dielectric constant; and
a carbon nitride cap layer located on the dielectric layer, the carbon nitride cap layer having a second dielectric constant that is less than the first dielectric constant such that the at least one of the first, second, third and fourth insulating layers thereby has a third dielectric constant that is less than the first dielectric constant.

12. The device of claim 11 wherein an etch stop layer interposes at least one pair of neighboring ones of the first, second, third and fourth insulating layers.

13. The device of claim 11 wherein at least two of the first and second vias and the first and second trenches form at least one dual-damascene structure.

14. The device of claim 11 further comprising at least one anti-reflective coating formed over one of the first, second, third and fourth insulating layers.

15. An integrated circuit apparatus, comprising:
a microelectronic device located at least partially in a substrate;
a dielectric first layer having a first dielectric constant and a first hardness; and
a second layer comprising carbon nitride and having a second dielectric constant and a second hardness, wherein:
one of the first and second layers interposes the substrate and the other of the first and second layers;
an aggregate dielectric constant of the first and second layers is less than the first dielectric constant; and
an aggregate hardness of the first and second layers is greater than the first hardness.

16. The integrated circuit apparatus of claim 15 wherein the interposing one of the first and second layers contacts the substrate and the other of the first and second layers.

17. The integrated circuit apparatus of claim 15 wherein the carbon nitride of the second layer has a composition of $C_xN_y$, where x ranges between 0.1 and 0.9 and y ranges between about 0.1 and 0.9.

18. A MEMs device, comprising:
a landing yoke configured to deflect in response to biasing thereof;
a mirror element coupled to the landing yoke; and
a control bus configured to bias the landing yoke;
wherein at least one of the landing yoke, mirror element and control bus includes a contact area coated with carbon nitride having a composition of $C_xN_y$, where x ranges between 0.1 and 0.9 and y ranges between about 0.1 and 0.9;
wherein a tip of the landing yoke is configured to contact the control bus in response to deflection of the landing yoke; and
wherein the tip is coated with carbon nitride.

19. The MEMs device of claim 18 wherein a mirror support post interposes the mirror element and the landing yoke, and wherein the mirror support post includes a sidewall ring spacer comprising carbon nitride.

20. A MEMs device, comprising:
a landing yoke configured to deflect in response to biasing thereof;
a mirror element coupled to the landing yoke; and
a control bus configured to bias the landing yoke;
wherein at least one of the landing yoke, mirror element and control bus includes a contact area coated with carbon nitride having a composition of $C_xN_y$, where x ranges between 0.1 and 0.9 and y ranges between about 0.1 and 0.9;
wherein a mirror support post interposes the mirror element and the landing yoke; and
wherein the mirror support post includes a sidewall ring spacer comprising carbon nitride.

* * * * *